(12) United States Patent
Choi et al.

(10) Patent No.: US 8,085,575 B2
(45) Date of Patent: Dec. 27, 2011

(54) NONVOLATILE MEMORY DEVICE AND METHOD OF DRIVING THE SAME

(75) Inventors: Byung-Gil Choi, Yongin-si (KR); Du-Eung Kim, Yongin-si (KR); Hye-Jin Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 141 days.

(21) Appl. No.: 12/585,728

(22) Filed: Sep. 23, 2009

(65) Prior Publication Data

US 2010/0080039 A1    Apr. 1, 2010

(30) Foreign Application Priority Data

Sep. 26, 2008  (KR) .......................... 10-2008-0094840

(51) Int. Cl.
  *G11C 11/00*  (2006.01)
(52) U.S. Cl. ........................................ 365/148; 365/203
(58) Field of Classification Search .................. 365/148, 365/203
  See application file for complete search history.

(56) References Cited

U.S. PATENT DOCUMENTS

| | | | |
|---|---|---|---|
| 6,515,887 B2 * | 2/2003 | Fujimoto | ........................ 365/63 |
| 6,711,051 B1 * | 3/2004 | Poplevine et al. | ............. 365/154 |
| 6,859,392 B2 | 2/2005 | Abedifard et al. | |
| 7,002,848 B2 * | 2/2006 | Takase et al. | ............. 365/185.28 |
| 7,020,006 B2 | 3/2006 | Chevallier et al. | |

FOREIGN PATENT DOCUMENTS

| | | |
|---|---|---|
| KR | 10-2003-0087674 | 11/2003 |
| KR | 10-2005-0027151 | 3/2005 |

\* cited by examiner

*Primary Examiner* — Michael Tran
(74) *Attorney, Agent, or Firm* — Harness, Dickey & Pierce, P.L.C.

(57) ABSTRACT

A nonvolatile memory device and a method of driving the same are provided, which adopt an improved write operation. The method of driving a nonvolatile memory device includes providing the nonvolatile memory device including a plurality of memory banks each having a plurality of local bit lines and a plurality of variable resistance memory cells; selectively connecting read global bit lines for reading data with the local bit lines, and firstly discharging the selectively connected local bit lines by turning on local bit line discharge transistors coupled to the read global bit lines; and selectively connecting write global bit lines for writing data with the local bit lines, and secondly discharging the selectively connected local bit lines by turning on global bit line discharge transistors.

19 Claims, 8 Drawing Sheets

[ 1st discharge ]

[ 2nd discharge ]

[ without 1st discharge ]

[ with 1st discharge ]

NONVOLATILE MEMORY DEVICE AND METHOD OF DRIVING THE SAME

FOREIGN PRIORITY STATEMENT

This application claims priority under 35 U.S.C. §119 to Korean Patent Application No. 10-2008-0094840, filed on Sep. 26, 2008 in the Korean Intellectual Property Office (KIPO), the entire contents of which are incorporated herein by reference.

BACKGROUND OF THE INVENTION

1. Field of the Invention

The embodiments relate to a nonvolatile memory device and a method of driving the same, and more particularly, to a nonvolatile memory device and a method of driving the same, which adopt an improved write operation.

2. Description of the Prior Art

A nonvolatile memory device using a resistance material includes a phase change random access memory (PRAM), a resistive RAM (RRAM), a magnetic RAM (MRAM), and the like. A dynamic RAM (DRAM) or a flash memory device stores data using charges, whereas the nonvolatile memory device using the resistance material stores data using a phase change of a phase change material such as a chalcogenide alloy (in the case of a PRAM), a resistance change of a variable resistance material (in the case of an RRAM), a resistance change of a magnetic tunnel junction (MTJ) thin film according to a magnetization state of a ferromagnetic material (in the case of an MRAM), and the like.

More specifically, the PRAM stores data using a phase change material such as a chalcogenide alloy of which the phase is changed to a crystalline state or an amorphous state as it is cooled after being heated. Since a phase change material in a crystalline state has a low resistance and a phase change material in an amorphous state has a high resistance, the crystalline state may be defined as a set state or a logic level "0", and the amorphous state may be defined as a reset state or a logic level "1".

In order to reduce a chip size in a nonvolatile memory device including a PRAM, a large number of local bit lines are simultaneously discharged during read and write operations, and in this case, the local bit lines being simultaneously discharged have large capacitances. In the process of simultaneously discharging the local bit lines having large capacitance values, ground noises may greatly bounce. Also, the greatly bouncing ground noises may cause a peripheral circuit region included in the nonvolatile memory device to malfunction.

SUMMARY OF THE INVENTION

Accordingly, at least one embodiment has been made to solve the above-mentioned problems occurring in the prior art, and an object of the present invention is to provide a nonvolatile memory device that adopts an improved write operation.

Another object of the at least one embodiment is to provide a method of driving a nonvolatile memory device that adopts an improved write operation.

Additional advantages, objects, and features of the invention will be set forth in part in the description which follows and in part will become apparent to those having ordinary skill in the art upon examination of the following or may be learned from practice of the invention.

In order to accomplish these objects, there is provided a nonvolatile memory device, according to at least one embodiment, which includes write global bit lines and read global bit lines coupled to a plurality of local bit lines, respectively; write local column selection transistors selectively connecting the write global bit lines with the local bit lines; read local column selection transistors selectively connecting the read global bit lines with the local bit lines; global bit line discharge transistors coupled to the write global bit lines; and local bit line discharge transistors coupled to the read global bit lines. The read local column selection transistors and the local bit line discharge transistors are turned on to firstly discharge the local bit lines, and the write local column selection transistors and the global bit line discharge transistors are turned on to secondly discharge the local bit lines.

In another aspect of at least one embodiment, there is provided a method of driving a nonvolatile memory device, which includes providing the nonvolatile memory device including a plurality of memory banks each having a plurality of local bit lines and a plurality of variable resistance memory cells coupled to the each local bit line; selectively connecting read global bit lines for reading data with the local bit lines, and firstly discharging the selectively connected local bit lines by turning on local bit line discharge transistors coupled to the read global bit lines; and selectively connecting write global bit lines for writing data with the local bit lines, and secondly discharging the selectively connected local bit lines by turning on global bit line discharge transistors.

In still another aspect of at least one embodiment, there is provided a method of driving a nonvolatile memory device, which includes providing the nonvolatile memory device including a plurality of memory banks each having a plurality of local bit lines and a plurality of variable resistance memory cells coupled to the each local bit line; firstly discharging all the bit lines included in the memory banks in which data is to be written among the plurality of memory banks; and secondly discharging the firstly discharged local bit lines in a program period in which the data is written.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
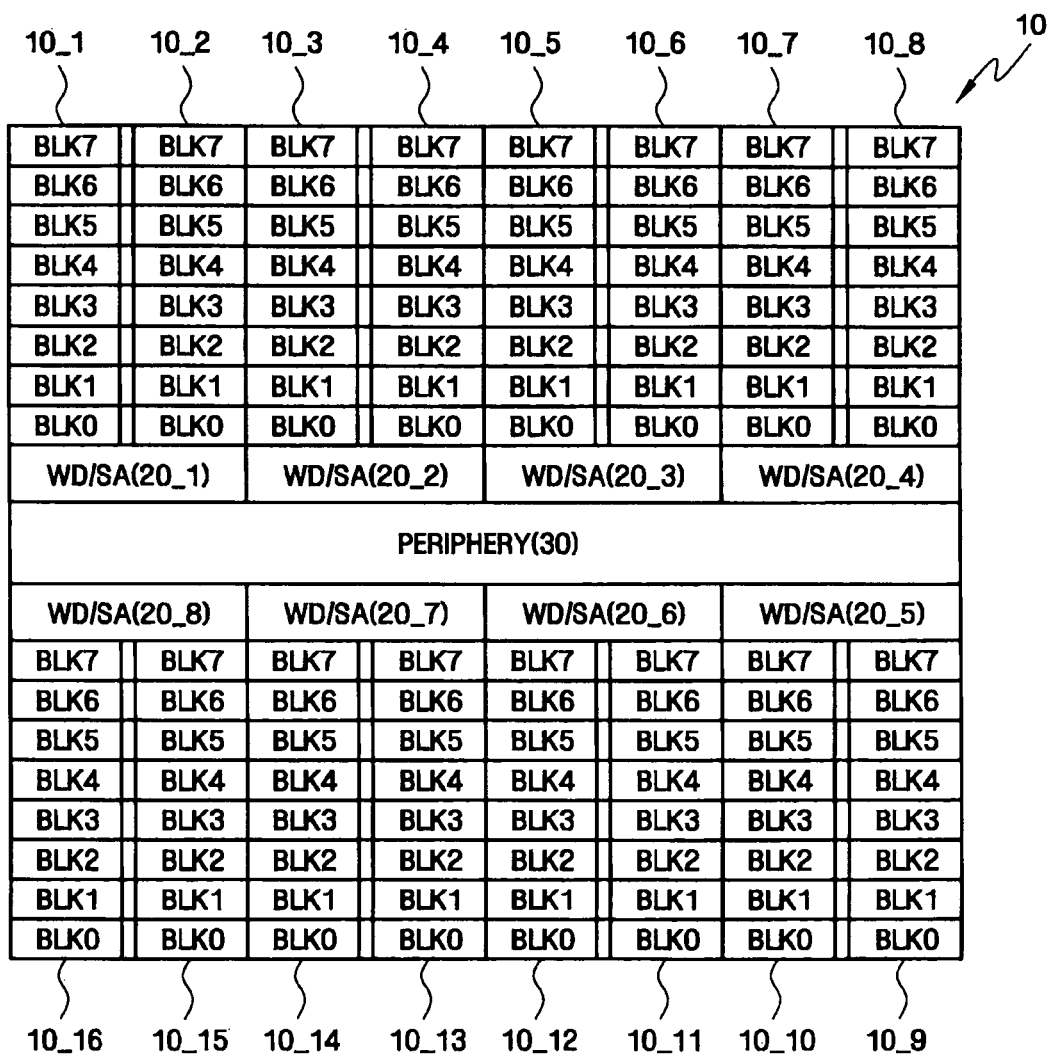
FIG. 1 is a layout diagram explaining a nonvolatile memory device according to an embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless specially defined, all terms (including technical and scientific terms) used in the description could be used as meanings commonly understood by those ordinary skilled in the art to which the embodiments belong. In addition, terms that are generally used but are not defined in the dictionary are not interpreted ideally or excessively unless they have been clearly and specially defined.

In the following description of the embodiments, a variable resistance memory cell means a memory cell of a nonvolatile memory device using a resistance material, such as a phase change RAM (PRAM), a resistive RAM (RRAM), a ferroelectric RAM (FRAM), and the like. Although a PRAM has been described as an example, it will be apparent to those of ordinary skill in the art to which the embodiments pertain that the embodiments can also be applied to nonvolatile memories using other resistance materials.

Figure 2:
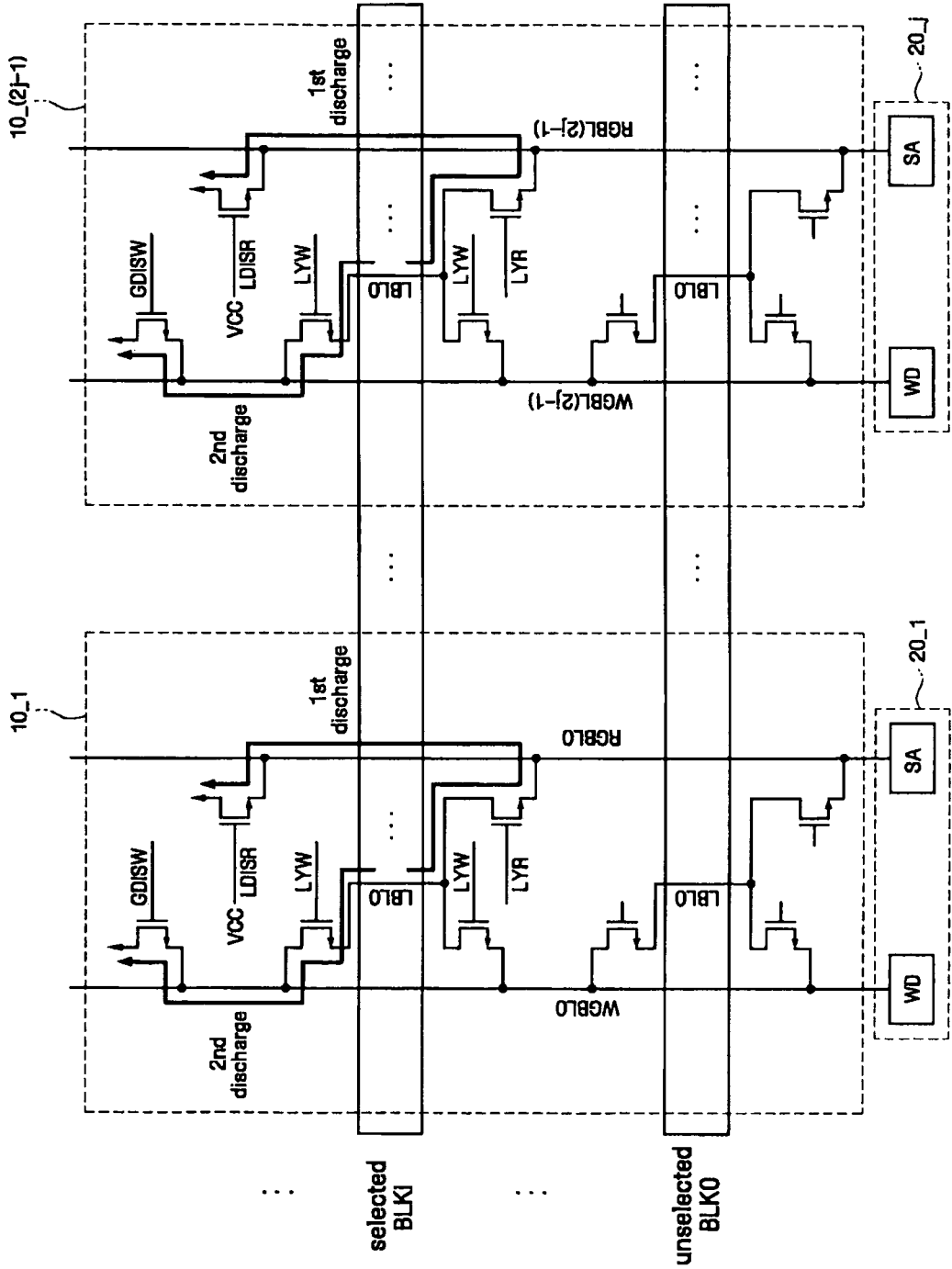
FIG. 2 is a circuit diagram explaining memory banks, write drivers and sense amplifiers of FIG. 1.
Figure 3:
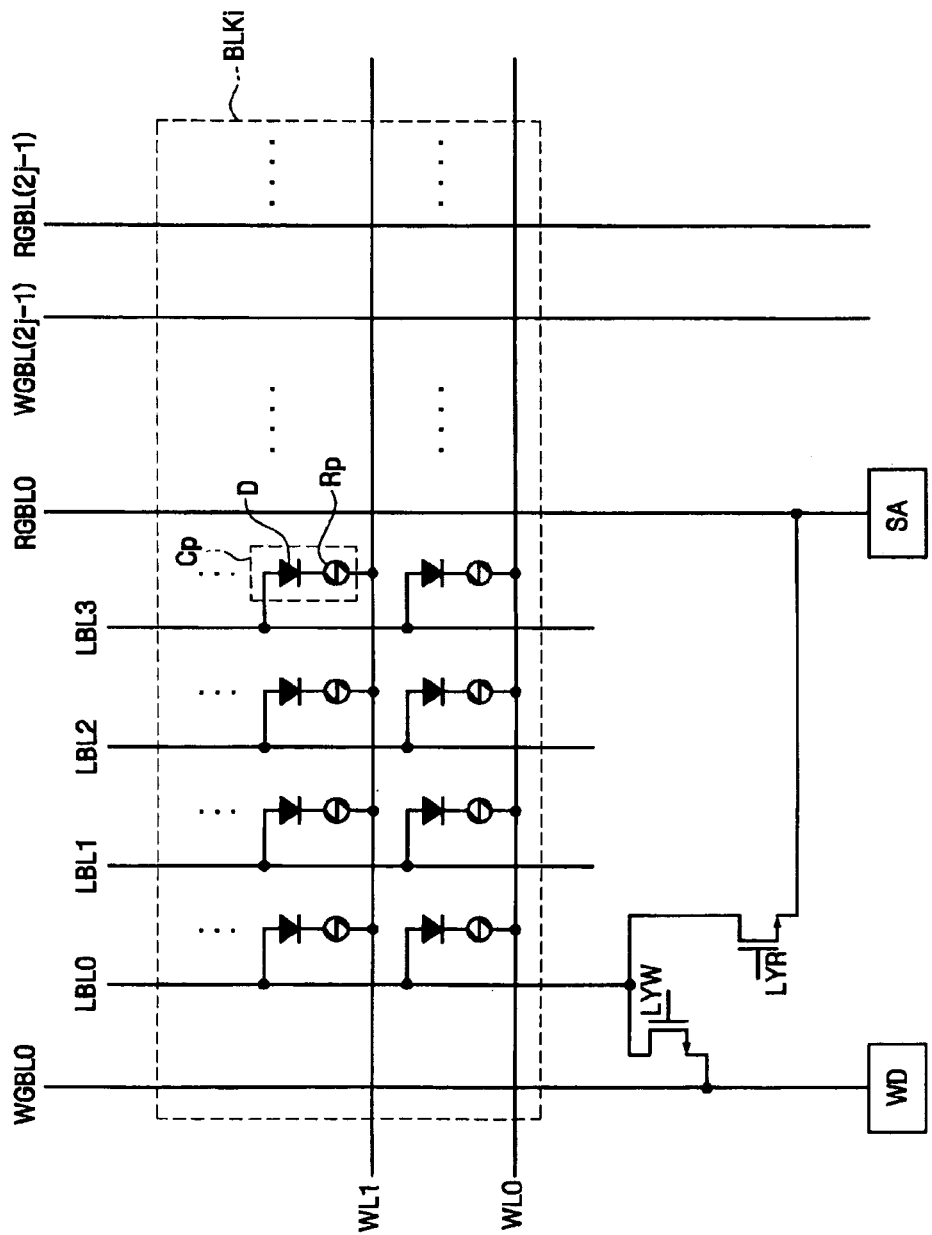
FIG. 3 is a circuit diagram explaining a certain memory block of FIG. 2.

FIG. 1 is a layout diagram explaining a nonvolatile memory device according to an embodiment. FIG. 2 is a circuit diagram explaining memory banks, write drivers and sense amplifiers of FIG. 1, and FIG. 3 is a circuit diagram explaining a certain memory block of FIG. 2. Although FIG. 1 illustrates an example embodiment in which a memory cell array includes 16 memory banks, the embodiments are not limited thereto and the memory cell array can include any number of memory banks. In FIG. 3, a region related to memory blocks BLKi is illustrated for convenience in explanation.

Referring to FIG. 1, the nonvolatile memory device according to an embodiment includes a memory cell array 10, a plurality of write drivers and sense amplifiers 20_1 to 20_8, and a peripheral circuit region 30.

The memory cell array 10 includes a plurality of memory banks 10_1 to 10_16, and each of the memory banks 10_1 to 10-16 is provided with a plurality of memory blocks BLK0 to BLK7. Each of the memory blocks BLK0 to BLK7 includes a plurality of variable resistance memory cells (See "Cp" in FIG. 3) arranged in the form of a matrix. Although it is exemplified that 8 memory blocks BLK0 to BLK7 are arranged in each memory bank as illustrated in FIG. 1, the embodiments are not limited thereto. As another example, 16 or 32 memory blocks may be arranged in a memory bank.

Although not illustrated in detail in the drawings, a row decoder and a column decoder are arranged to designate rows and columns of variable resistance memory cells to be written/read, respectively, corresponding to the memory banks 10_1 to 10_16.

The write drivers and sense amplifiers 20_1 to 20_8 are arranged to correspond to two memory banks 10_1 to 10_16, and perform read and write operations in the corresponding memory banks. Although it is exemplified that the write drivers and sense amplifiers 20_1 to 20_8 each correspond to two of memory banks 10_1 to 10_16, respectively, as illustrated in FIG. 1, the embodiments are not limited thereto. As another example, the write drivers and sense amplifiers 20_1 to 20_8 may be arranged to correspond to one or four memory banks.

In the peripheral circuit region 30, a plurality of logic circuit blocks and a voltage generation unit for operating the row decoder, the column decoder, the write drivers and sense amplifiers 20_1 to 20_8 are arranged.

FIG. 2 illustrates a selected memory block BLKi (i=0~7) and an unselected memory block BLK0 among the plurality of memory blocks BLK0 to BLK7 of FIG. 1. In FIG. 2, the write driver and sense amplifier 20__j (j=2~8) may be any one of the write drivers and sense amplifiers 20_2 to 20_8. Although FIG. 1 illustrates the write drivers and sense amplifiers 20_1 to 20_8 each arranged to correspond to two memory banks, respectively, FIG. 2 illustrates only one memory bank 10_1 or 10_(2j−1) for simplicity of illustration. Hereinafter, the write driver and sense amplifier 20_1 and the memory bank 10_1 connected thereto will be explained. In FIG. 2, a plurality of local bit lines coupled to the global bit line WGBL0 and the read global bit line RGBL0, and only one local bit line LBL0 are illustrated for simplicity of illustration.

Referring to FIGS. 1 and 2, the write driver WD is coupled to the write global bit line WGBL0, and provides a write bias to the write global bit line WGBL0. That is, the write driver WD can write data in the memory bank 10_1 through the write global bit line WGBL0. The write bias is provided to write data in at least one variable resistance memory cell.

The write local column selection transistor LYW is coupled between the write global bit line WGBL0 and the local bit line LBL0. The write local column selection transistor LYW selectively connects the write global bit line WGBL0 and the local bit line LBL0 in response to a control signal (e.g. a local bit line discharge signal). The write local column selection transistors LYW, as illustrated in the drawing, are coupled between one end of the local bit line LBL0 and the write global bit line WGBL0, and also between the other end of the local bit line LBL0 and the write global bit line WGBL0.

To the write global bit line WGBL0, a global bit line discharge transistor GDISW is also connected to discharge the write global bit line WGBL0 in response to a control signal (e.g. a global bit line discharge signal).

The sense amplifier SA is coupled to the read global bit line RGBL0, and senses current, which varies in accordance with the data stored in the variable resistance memory cell, from the read global bit line RGBL0. That is, the sense amplifier SA reads data from the memory bank 10_1 through the read global bit line RGBL0.

The read local column selection transistor LYR is coupled between the read global bit line RGBL0 and the local bit line LBL0. The read local column selection transistor LYR selectively connects the read global bit line RGBL0 and the local bit line LBL0 in response to the control signal (e.g. the read global bit line RGBL0 and the local bit line LBL0).

To the read global bit line RGBL0, a local bit line discharge transistor LDISW is also connected to discharge the local bit line LBL0 in response to a control signal VCC.

Referring to FIG. 3, the memory block BLKi includes a plurality of variable resistance memory cells Cp, a plurality of write global bit lines WGBL0 to WGBLj, a plurality of read global bit lines RGBL0 to RGBLj, a plurality of local bit lines LBL0, LBL1, LBL2, and LBL3), a plurality of word lines WL0 and WL1, a write local column selection transistor LYW, a read local column selection transistor LYR, and the like.

The plurality of variable resistance memory cells Cp are positioned in a region where the word lines WL0 and WL1 and the local bit lines LBL0, LBL1, LBL2, and LBL3 cross each other, and are arranged in the form of a matrix. Each respective variable resistance memory cell Cp includes a variable resistance element Rp having a different resistance level in accordance with data stored therein, and an access element D controlling current flowing through the variable resistance element Rp. For example, in the case of the variable resistance memory cell Cp capable of storing one bit, the variable resistance element Rp may have resistance levels corresponding to one of set data and reset data, respectively.

Referring to FIG. 3, in the case where the variable resistance memory cell Cp is a phase change memory cell Cp, the variable resistance element Rp may be a phase change material which is in a crystalline state or in an amorphous state in accordance with a tunneling current, and which has different resistance levels in accordance with its states. The phase change material may be a material formed by combining two elements, such as GaSb, InSb, InSe, SB2Te3, and GeTe, a material formed by combining three elements, such as GeSbTe, GaSeTe, InSbTe, SnSb2Te4, and InSbGe, or a material formed by combining four elements, such as AgInSbTe, (GeSn)SbTe, GeSb(SeTe), and Te81Ge15Sb2S2. Among them, GeSbTe, which is composed of germanium (Ge), antimony (Sb), and tellurium (Te), is mainly used as the phase change material. The access element D may be a diode or a transistor coupled in series to the variable resistance element Rp. In the drawing, a cell diode is illustrated as the access element D.

The plurality of local bit lines LBL0, LBL1, LBL2, and LBL3 are connected and branched to the write global bit lines WGBL0 to WGBLj and the read global bit lines RGBL0 to RGBLj so as to form a hierarchical bit line structure. Specifically, the plurality of write global bit lines WGBL0 to WGBLj and the plurality of read global bit lines RGBL0 to RGBLj are formed to extend in one direction so that they are common to the plurality of memory blocks (See "BLK0~BLK7" in FIG. 1). Also, the plurality of bit lines BL0, BL1, BL2, and BL3 are connected to the write global bit lines WGBL0 to WGBLj and the read global bit lines RGBL0 to RGBLj, and the plurality of variable resistance memory cells Cp are connected to the bit lines BL0, BL1, BL2, and BL3, respectively.

Figure 4:
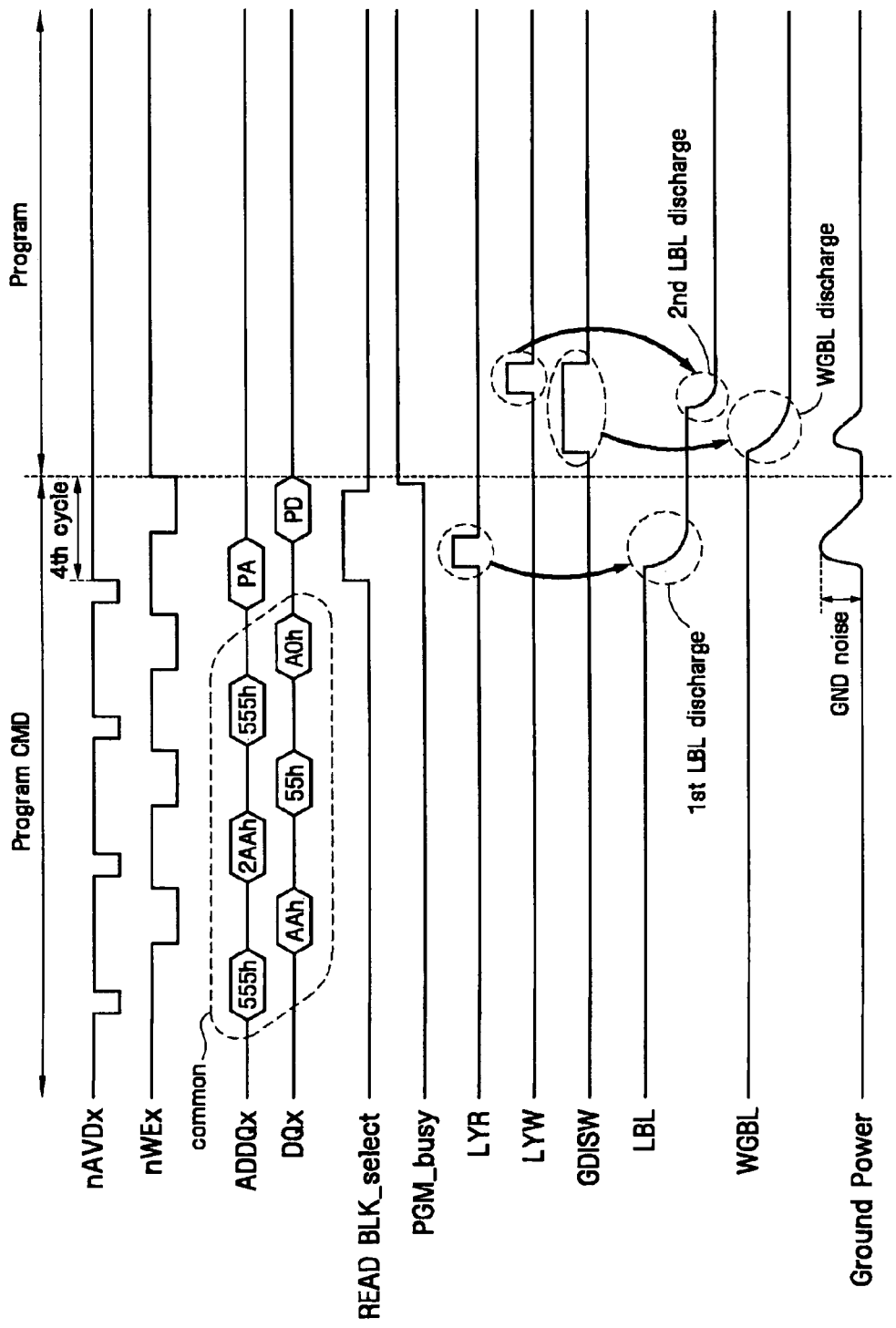
FIG. 4 is a timing diagram explaining an operation of the circuit as illustrated in FIG. 2.
Figure 5A:
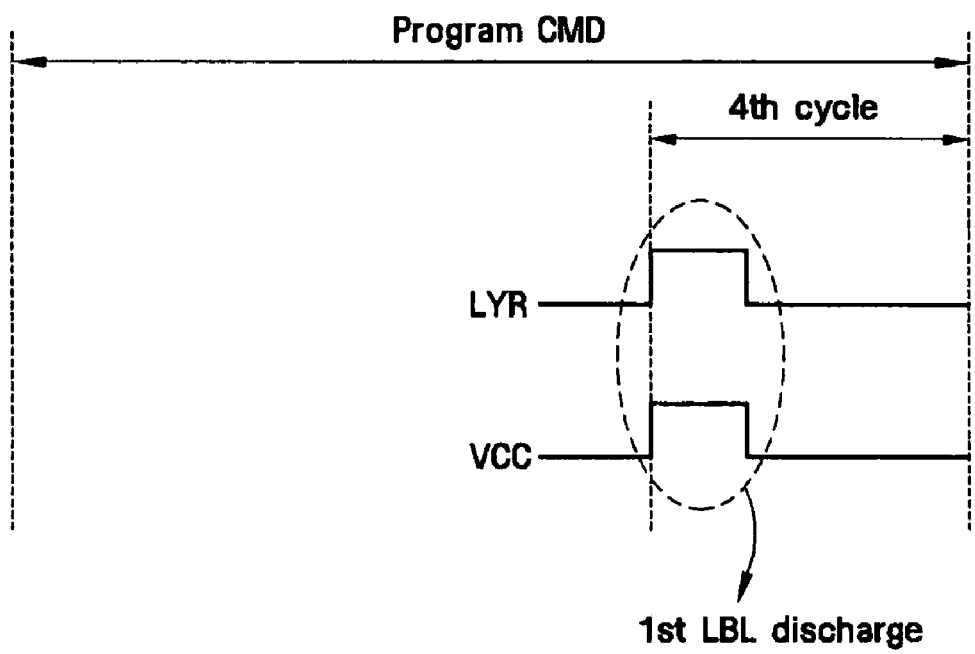
FIGS. 5A and 5B are timing diagrams explaining a first discharge operation and a second discharge operation in FIG. 4.
Figure 5B:
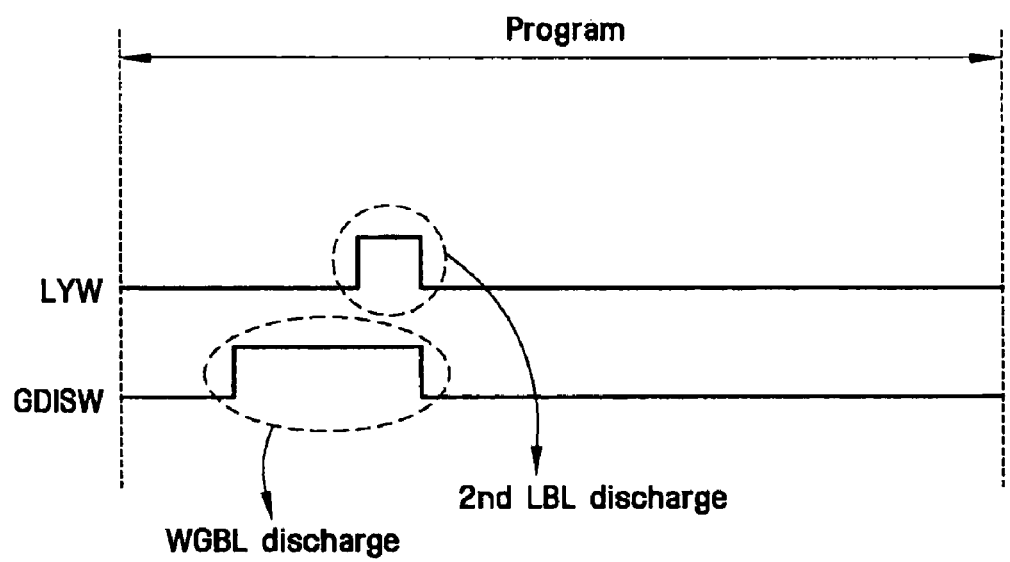

FIG. 4 is a timing diagram explaining an operation of the circuit as illustrated in FIG. 2, and FIGS. 5A and 5B are timing diagrams explaining a first discharge operation and a second discharge operation in FIG. 4.

In the timing diagram as illustrated in FIG. 4, an effective address signal nAVDx is a signal indicating that an address ADDQx inputted through an address pin is effective. The address is inputted from an outside through the address pin, and for example, the address inputted when the effective address signal nAVDx is at a low level is the effective address. On the other hand, when a write enable signal nWEx is at a low level, write data DQx is inputted from an outside. Also, if a program activation signal PGM_busy becomes high, a program period starts, and a write operation is performed in the program period.

Referring to FIG. 4, a program command (CMD) period may be divided into four cycles. Each cycle is reckoned from a rising edge at which the effective address signal nAVDx is transitioned from a low level to a high level. In FIG. 4, only the fourth cycle is illustrated.

In the program CMD period, addresses 555; h, 2AAh, and 555h inputted from an outside and data AAh, 55h, and A0h corresponding to them are common addresses and data. The memory bank, which is selected by a read memory bank selection signal (not illustrated) having a high level in a period corresponding to the addresses and data, is not recognized as a memory bank to write data therein.

In the fourth cycle of the program CMD period, an address PA and data PD corresponding to the address are inputted from an outside. The memory bank, which is selected by the read memory bank selection (READ BLK_select) signal having a high level in the period corresponding to the addresses and data, is recognized as a memory bank to write data therein, and then the program period starts. That is, in the fourth cycle, the memory bank to be written is selected.

The operation of the circuit as illustrated in FIG. 2 includes a first discharge operation and the second discharge operation.

First, referring to FIGS. 2, 4, and 5A, the first discharge operation is described. In the fourth cycle of the program CMD period, the control signal (e.g. the local bit line discharge signal) being applied to the read local column selection transistor LYR goes to a high level. Also, the control signal VCC being applied to the local bit line discharge transistor LDISR goes to a high level. As a result, a current loop, which is composed of the local bit line LBL0, the read local column selection transistor LYR, the read global bit line RGBL0, and the local bit line discharge transistor LDISR, is formed, and electric charges flow through the loop, so that a first local bit line (LBL) discharge is performed. That is, all the local bit lines of the memory bank to be written (i.e. selected BLKi) are firstly discharged. For example, the local bit lines of, for example, 1.3V are discharged to be 0V.

Then, referring to FIGS. 2, 4, and 5B, the second discharge operation is described. In the program period, the control signal (e.g. the global bit line discharge signal) being applied to the global bit line discharge transistor GDISW goes to a high level. As a result, the write global bit line WGBL0 is discharged.

The control signal being applied to the global bit line discharge transistor GDISW overlaps the latter half of a high-level period, and thus the control signal (e.g. the local bit line discharge signal) being applied to the write local column selection transistor LYW goes to a high level. As a result, a current loop, which is composed of the local bit line LBL0, the write local column selection transistor LYW, the write global bit line WGBL0, and the global bit line discharge transistor GDISW, is formed, and electric charges flow through the loop, so that a second local bit line (LBL) discharge is performed. That is, all the local bit lines of the memory bank to be written (i.e. selected BLKi) are secondly discharged.

Figure 6A:
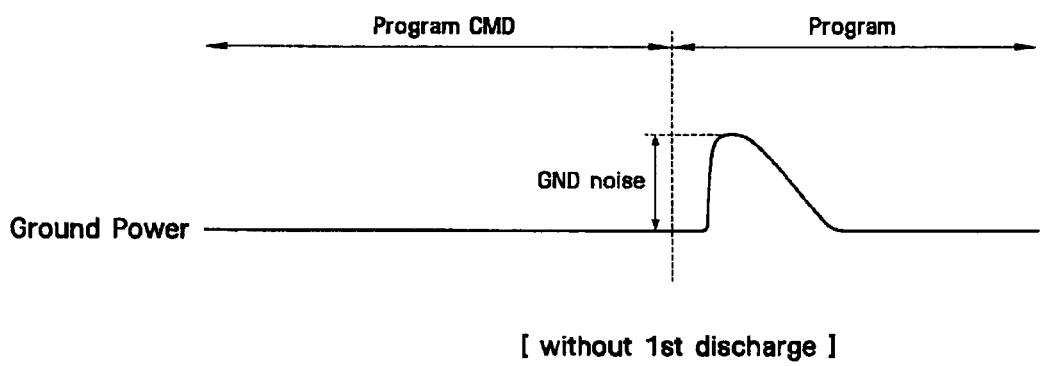
FIGS. 6A and 6B are views explaining ground noises in a comparative example and an embodiment.
Figure 6B:
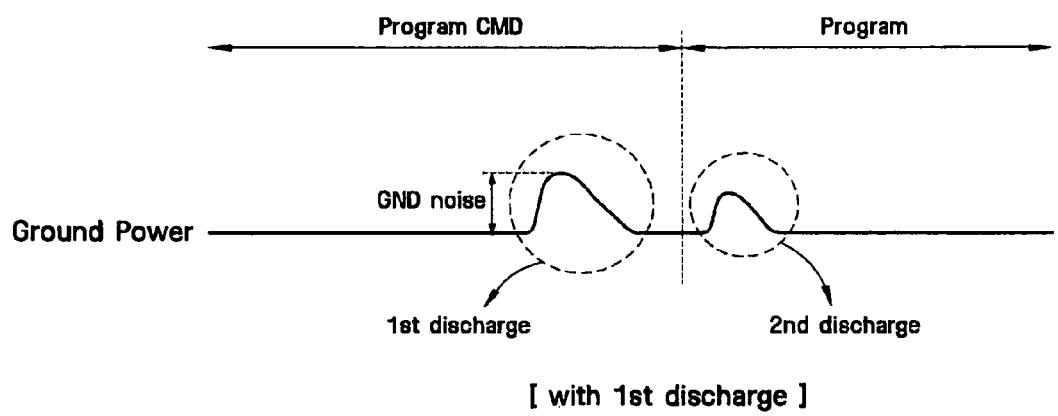

Referring to FIGS. 6A and 6B, a ground noise according to an embodiment of will be described in comparison to a ground noise ground noise in a comparative example. In FIGS. 6A and 6B, terms "ground power" indicate ground voltage levels in the comparative example and in an embodiment. In the comparative example, the first discharge operation in an embodiment is not performed.

Referring to FIGS. 6A and 6B, according to an embodiment, the ground noise is generated twice due to the first discharge operation and the second discharge operation. By contrast, according to the comparative example, the first discharge operation is not performed, and thus the ground noise is generated once in a period corresponding to the second discharge operation in an embodiment.

However, in order to reduce the chip size in the nonvolatile memory device, a large number of local bit lines are simultaneously discharged during a read operation and a write operation, and at this time, the capacitance of the local bit lines being simultaneously discharged becomes great. For example, the capacitance of the simultaneously discharged local bit lines may become, for example, 9 nF during the write operation, and may become, for example, 6 nF during the read operation.

In the process of simultaneously discharging the local bit lines having the large capacitance value, a ground noise, i.e. a ground noise greatly bouncing as illustrated in FIG. 6A may be generated, and this greatly bouncing ground noise may cause a malfunction of the peripheral circuit region (See "30" in FIG. 1).

In an embodiment, all the local bit lines belonging to the memory bank to be written are firstly discharged by performing the first local bit line (LBL) discharge in the program CMD period. Accordingly, a burden of discharge of all the local bit lines during the program period can be actually lightened, and thus the bouncing of the ground noise as illustrated in FIG. 6B can be reduced. That is, the bouncing of the ground voltage can be reduced by reducing the capacitance of the local bit lines being discharged without affecting the operation speed. As described above, by improving the discharge operation of the local bit lines, a malfunction of the peripheral circuit region, which may be caused during the write operation, can be reduced. As a result, the reliability of the write operation of the nonvolatile memory device can be improved.

Figure 7:
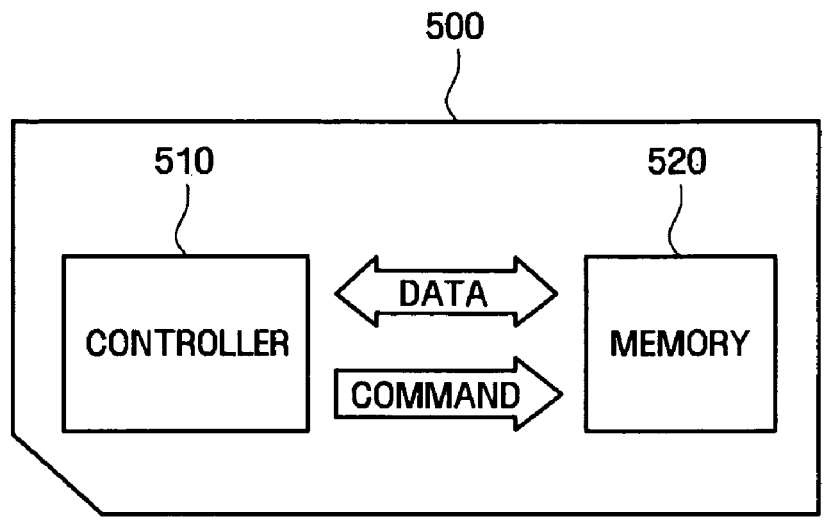
FIG. 7 is a schematic diagram roughly illustrating a memory card 500 according to example embodiments.

FIG. 7 is a schematic diagram illustrating a memory card 500 according to example embodiments. Referring to FIG. 20, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include one of the non-volatile memory devices described above in reference to FIGS. 1 through 6B. The controller 510 may provide the read memory bank selection signal READ BLK_select, effective address signal nAVDx, local bit line discharge signal, the control signal VCC, the global bit line discharge signal, and the write enable signal nWEX discussed above with reference to FIG. 4 to the memory 520.

Such a memory card 500 may be used as a storage medium for various portable electronic devices. For example, the memory card 500 may be a multimedia card (MMC) or a secure digital (SD) card.

Figure 8:
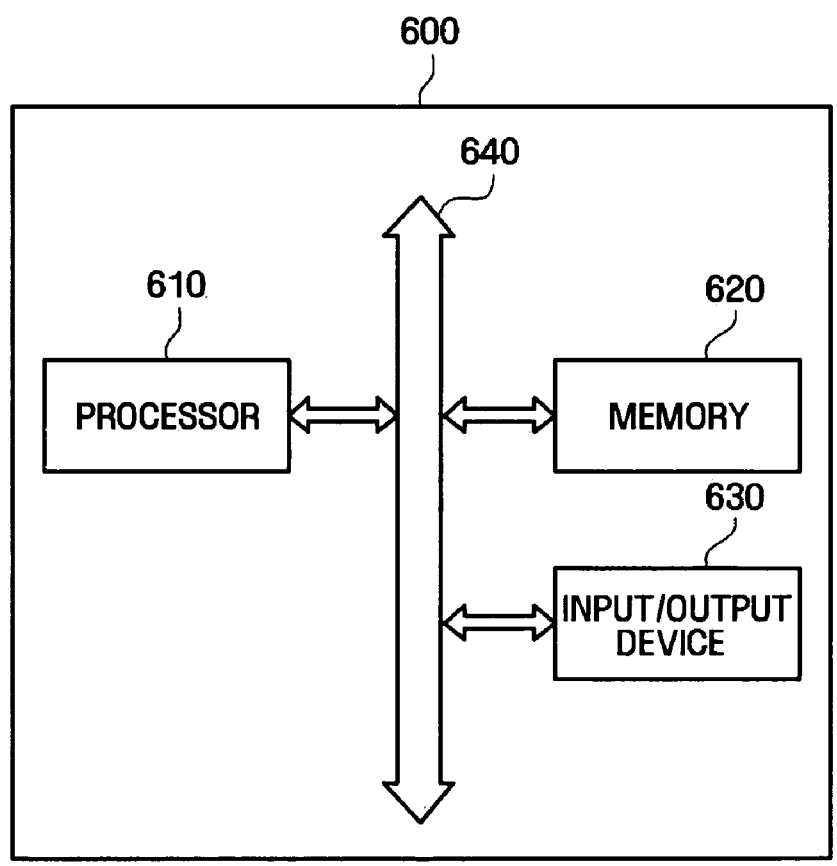
FIG. 8 is a block diagram roughly illustrating an electronic system 600 according to example embodiments.

FIG. 8 is a block diagram roughly illustrating an electronic system 600 according to example embodiments. Referring to FIG. 21, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device, e.g. a personal computer or a network, by using the input/output device 630 and may exchange data with the external device.

The memory 620 may store codes or programs for operations of the processor 610. For example, the memory 620 may include one of the non-volatile memory devices described above in reference to FIGS. 1 through 6B.

For example, such an electronic system 600 may embody various electronic control systems requiring the memory 620, and, for example, may be used in mobile phones, MP3 players, navigation devices, solid state disks (SSD), or household appliances.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A method of driving a nonvolatile memory device including a plurality of memory banks each having a plurality of local bit lines and a plurality of variable resistance memory cells coupled to each of the plurality of local bit lines, comprising:
   selectively connecting read global bit lines for reading data with local bit lines from among the plurality of local bit lines;

performing a first discharge operation including discharging the selectively connected local bit lines by turning on local bit line discharge transistors coupled to the read global bit lines;

selectively connecting write global bit lines with the local bit lines, the write global bit lines for writing data; and performing a second discharge operation including discharging the selectively connected local bit lines by turning on global bit line discharge transistors coupled to the write global bit lines.

2. The method of claim 1, wherein the first discharge operation is performed prior to a program period during which data is written, and the second discharge operation is performed during the program period.

3. The method of claim 2, wherein the first discharge operation is performed during a program command period including a plurality of cycles such that the first discharge operation is performed during cycles from among the plurality of cycles during which memory banks from among the plurality of memory banks, in which the data is to be written, are selected.

4. The method of claim 1, wherein the first discharge operation and the second discharge operation discharge all the local bit lines included in the selected memory banks.

5. The method of claim 1, wherein the second discharge operation is performed by selectively connecting the write global bit lines with the local bit lines in a latter half of a period in which the write global bit lines are discharged by turning on the global bit line discharge transistors.

6. The method of claim 1, wherein ground noises are generated during a period in which the first discharge operation is performed and during a period in which the second discharge operation is performed.

7. A method of driving a nonvolatile memory device including a plurality of memory banks each having a plurality of local bit lines and a plurality of variable resistance memory cells coupled to each of the plurality of local bit lines, comprising:

performing a first discharge operation by discharging local bit lines from among the plurality of local bit lines included in memory banks from among the plurality of memory banks in which data is to be written; and performing a second discharge operation by discharging the discharged local bit lines in a program period during which the data is written, wherein the nonvolatile memory device further comprises read global bit lines coupled to the plurality of local bit lines, and local bit line discharge transistors coupled to the read global bit lines, and wherein the first discharge operation comprises selectively connecting the read global bit lines with local bit lines from among the plurality of local bit lines, and turning on the local bit line discharge transistors.

8. A method of driving a nonvolatile memory device including a plurality of memory banks each having a plurality of local bit lines and a plurality of variable resistance memory cells coupled to each of the plurality of local bit lines, comprising:

performing a first discharge operation by discharging local bit lines from among the plurality of local bit lines included in memory banks from among the plurality of memory banks in which data is to be written; and performing a second discharge operation by discharging the discharged local bit lines in a program period during which the data is written, wherein the nonvolatile memory device further comprises write global bit lines coupled to the plurality of local bit lines, and global bit line discharge transistors coupled to the write global bit lines, and wherein the second discharge operation comprises selectively connecting the write global bit lines with the local bit lines, and turning on the global bit line discharge transistors.

9. The method of claim 8, wherein the second discharge operation comprises selectively connecting the write global bit lines with the local bit lines in a latter half of a period during which the global bit line discharge transistors are turned on.

10. The method of claim 7, wherein the first discharge operation is performed during a program command period including a plurality of cycles such that the first discharge operation is performed during cycles from among the plurality of cycles during which memory banks from among the plurality of memory banks, in which the data is to be written, are selected.

11. The method of claim 7, wherein ground noises are generated during a period in which the first discharge operation is performed and during a period in which the second discharge operation is performed.

12. A nonvolatile memory device comprising:

a plurality of local bit lines;

a controller configured to generate control signals, write global bit lines coupled to the plurality of local bit lines, respectively;

read global bit lines coupled to the plurality of local bit lines, respectively;

write local column selection transistors configured to selectively connect the write global bit lines with the plurality of local bit lines;

read local column selection transistors configured to selectively connect the read global bit lines with the plurality of local bit lines;

global bit line discharge transistors coupled to the write global bit lines; and local bit line discharge transistors coupled to the read global bit lines, wherein the read local column selection transistors and the local bit line discharge transistors are configured to perform a first discharge operation by discharging the local bit lines when turned on, and the write local column selection transistors and the global bit line discharge transistors are configured to perform a second discharge operation by discharging the local bit lines when turned on.

13. The nonvolatile memory device of claim 12, wherein the controller is configured to control read local column selection transistors and the local bit line discharge transistors to perform the first discharge operation prior to a program period in which data is written, and configured to control the write local column selection transistors and the global bit line discharge to perform the second discharge operation during the program period.

14. The nonvolatile memory device of claim 13, further comprising a plurality of memory banks each of which includes a plurality of variable resistance memory cells coupled to the plurality of local bit lines, wherein the program command period includes a plurality of cycles, and the controller is configured to control the read local column selection transistors and the local bit line discharge transistors to perform the first discharge operation during cycles in which memory banks from among the plurality of memory banks, in which the data is to be written, are selected.

15. The nonvolatile memory device of claim 12, further comprising a plurality of memory banks each of which includes a plurality of variable resistance memory cells coupled to the plurality of local bit lines;
    wherein the controller is configured to control the read local column selection transistors, the local bit line discharge transistors, the write local column selection transistors and the global bit line discharge transistors to perform the first discharge operation and the second discharge operation such that all local bit lines from among the plurality of local bit lines included in selected memory banks from among the plurality of memory banks are discharged.

16. The nonvolatile memory device of claim 12, wherein the controller is configured to control the write local column selection transistors and the global bit line discharge transistors to perform the second discharge operation by turning on the write local column selection transistors in a latter half of a period during which the write global bit lines are discharged by turning on the global bit line discharge transistors.

17. The nonvolatile memory device of claim 12, wherein ground noises are generated during a period in which the first discharge operation is performed and during a period in which the second discharge operation is performed.

18. The nonvolatile memory device of claim 12, further comprising a plurality of memory banks each of which includes a plurality of variable resistance memory cells coupled to the plurality of local bit lines,
    wherein each of the plurality of variable resistance memory cells is one of a phase change random access memory (PRAM) and a resistive RAM (RRAM).

19. The nonvolatile memory device of claim 12, further comprising:
    a write driver connected to the write global bit lines and configured to provide a write bias to the write global bit lines;
    a sense amplifier connected to the read global bit lines and configured to sense current flowing through the read global bit lines; and
    a peripheral circuit region configured to operate the write driver and the sense amplifier.

\* \* \* \* \*